US009301071B2

(12) United States Patent
Vinayak

(10) Patent No.: US 9,301,071 B2
(45) Date of Patent: Mar. 29, 2016

(54) REDUCING AUDIO DISTORTION IN AN AUDIO SYSTEM

(71) Applicant: Quantance, Inc., Woburn, MA (US)

(72) Inventor: Vikas Vinayak, Menlo Park, CA (US)

(73) Assignee: QUANTANCE, INC., Woburn, MA (US)

( * ) Notice: Subject to any disclaimer, the term of this patent is extended or adjusted under 35 U.S.C. 154(b) by 159 days.

(21) Appl. No.: 13/797,590

(22) Filed: Mar. 12, 2013

(65) Prior Publication Data

US 2014/0270207 A1 Sep. 18, 2014

(51) Int. Cl.

*H04R 29/00* (2006.01)
*H03G 11/00* (2006.01)
*H04R 3/04* (2006.01)
*H04R 3/00* (2006.01)

(52) U.S. Cl.

CPC ................ *H04R 29/001* (2013.01); *H04R 3/04* (2013.01); *H04R 3/002* (2013.01)

(58) Field of Classification Search

CPC ...... H04R 29/001; H04R 29/003; H04R 3/04; H04R 3/08; H04R 3/002
USPC ................................................ 381/59, 58, 55
See application file for complete search history.

(56) References Cited

U.S. PATENT DOCUMENTS 5,600,718 A 2/1997 Dent et al.
7,039,201 B1 5/2006 Lee et al.
2005/0031139 A1 2/2005 Browning et al.
2005/0031140 A1* 2/2005 Browning ....................... 381/96
2011/0087346 A1 4/2011 Larsen et al.
2011/0148519 A1 6/2011 Drogi et al.
2014/0126730 A1* 5/2014 Crawley et al. ................. 381/59

FOREIGN PATENT DOCUMENTS

EP 2890160 A1 7/2015

OTHER PUBLICATIONS

PCT International Search Report and Written Opinion, PCT Application No. PCT/US2014-021425, Jun. 25, 2014, 11 pages.
Klippel, W., "Active Compensation of Transducer Nonlinearities," Symposium Nonlinear Compensation of Loudspeakers, Technical University of Denmark, 2003, 38 pages.
Klippel, W., "Loudspeaker Nonlinearities—Causes, Parameters, Symptoms," Audio Engineering Society, 2005, pp. 1-69.
Schurer, H. et al., "Exact Input-Output Linearization of an Electrodynamical Loudspeaker," Audio Engineering Society, 1996, pp. 1-14.
Extended European Search Report from corresponding EP Application No. 147794002 dated Feb. 4, 2016.

* cited by examiner

*Primary Examiner* — Vivian Chin
*Assistant Examiner* — Douglas Suthers
(74) *Attorney, Agent, or Firm* — Lando & Anastasi, LLP

(57) ABSTRACT

An audio system comprises an audio driver configured to receive a target audio signal and a feedback signal and to generate an adjusted audio signal responsive to the target audio signal and the feedback signal. A loudspeaker is configured to convert the adjusted audio signal into acoustical sound. A test signal generator is configured to generate a test signal having a higher frequency than the target audio signal. The test signal causes a test current to flow through the loudspeaker. A current sensing circuit is configured to measure the test current flowing through the loudspeaker and to generate a current sense signal indicative of the test current. A feedback circuit is configured generates the feedback signal responsive to the current sense signal.

19 Claims, 10 Drawing Sheets

REDUCING AUDIO DISTORTION IN AN AUDIO SYSTEM

BACKGROUND

1. Field of Technology

Embodiments disclosed herein relate to audio systems, and more specifically to an audio system for reducing audio distortion of a loudspeaker.

2. Description of the Related Arts

A loudspeaker is a device that receives an electrical signal and converts the electrical signal to audible sound. Loudspeakers can include a voice coil that is inside of a magnet and is also attached to a diaphragm (e.g., a cone). When an electrical signal is applied to the voice coil, the coil generates a magnetic field that causes the voice coil and its attached diaphragm to move. The movement of the diaphragm pushes the surrounding air and generates sound waves.

For better sound fidelity, the sound waves produced by a loudspeaker should be proportional to the electrical signal applied to the loudspeaker. However, in a real loudspeaker, the movement of the diaphragm is not exactly proportional to the applied electrical signal, and this deviation leads to loss of acoustical fidelity. The loss of acoustical fidelity is especially pronounced with small loudspeakers, such as those found in mobile phones, tablet computers, laptops, and other portable devices.

There are several causes of the deviation between the electrical signal and the movement of the diaphragm. First, the coil and its associated parasitics are reactive and the magnetic field created by the coil varies depending on the frequency of the applied electrical signal. This results in a non-flat frequency response of the coil. Second, the effect of the magnetic field of the magnet on the coil is not constant as the position of the coil changes inside the magnet. As the coil moves backward and forward in response to the applied electrical signal, its position relative to the magnet changes. This changes the amount by which the magnetic field of the coil and the magnetic field of the magnet interact, resulting in movement of the diaphragm the extent of which is dependent upon the current position of the coil. Third, the springiness of the suspension supporting the diaphragm is not constant, and varies depending on how far it the diaphragm is displaced from its nominal position. All of these factors lead to increased distortion in the sound produced by a loudspeaker.

SUMMARY OF THE INVENTION

Embodiments disclosed herein describe an audio system that measures a test current through the loudspeaker as a way to measure the capacitance of the loudspeaker. The test current is used as feedback to generate a feedback signal that represents an actual displacement of the loudspeaker diaphragm. The feedback signal can then be used in a feedback loop to adjust a target audio signal, resulting in increased audio fidelity.

In one embodiment, the audio system comprises an audio driver configured to receive a target audio signal and a feedback signal and to generate an adjusted audio signal responsive to the target audio signal and the feedback signal. A loudspeaker is configured to convert the adjusted audio signal into acoustical sound. A test signal generator is configured to generate a test signal having a higher frequency than the target audio signal. The test signal also causes a test current to flow through the loudspeaker. A current sensing circuit is configured to measure the test current flowing through the loudspeaker and to generate a current sense signal indicative of the test current. A feedback circuit configured to generate the feedback signal responsive to the current sense signal. For example, the feedback circuit may be a look up table or a non-linear circuit that generates the feedback signal so that it represents an actual displacement of the loudspeaker.

In one embodiment, a method of operation in an audio system is disclosed. The method comprises generating an adjusted audio signal responsive to a target audio signal and a feedback signal; converting the adjusted audio signal into acoustical sound with a loudspeaker; generating a test signal having a higher frequency than the target audio signal, the test signal causing a test current to flow through the loudspeaker; measuring the test current flowing through the loudspeaker; generating a current sense signal indicative of the test current; and generating the feedback signal responsive to the current sense signal.

BRIEF DESCRIPTION OF THE DRAWINGS

The teachings of the embodiments disclosed herein can be readily understood by considering the following detailed description in conjunction with the accompanying drawings.

DETAILED DESCRIPTION OF EMBODIMENTS

The Figures (FIG.) and the following description relate to various embodiments by way of illustration only. It should be noted that from the following discussion, alternative embodiments of the structures and methods disclosed herein will be readily recognized as viable alternatives that may be employed without departing from the principles discussed herein.

Reference will now be made in detail to several embodiments, examples of which are illustrated in the accompanying figures. It is noted that wherever practicable similar or like reference numbers may be used in the figures and may indicate similar or like functionality. The figures depict various embodiments for purposes of illustration only. One skilled in the art will readily recognize from the following description that alternative embodiments of the structures and methods illustrated herein may be employed without departing from the principles described herein.

Embodiments disclosed herein describe an audio system that measures a test current through the loudspeaker as a proxy for the capacitance of the loudspeaker. The test current is used as feedback to generate a feedback signal that represents an actual displacement of the loudspeaker diaphragm. The feedback signal can then be used in a feedback loop to adjust a target audio signal, resulting in a displacement of the speaker that more accurately matches the target audio signal, which increases audio fidelity.

Figure 1:
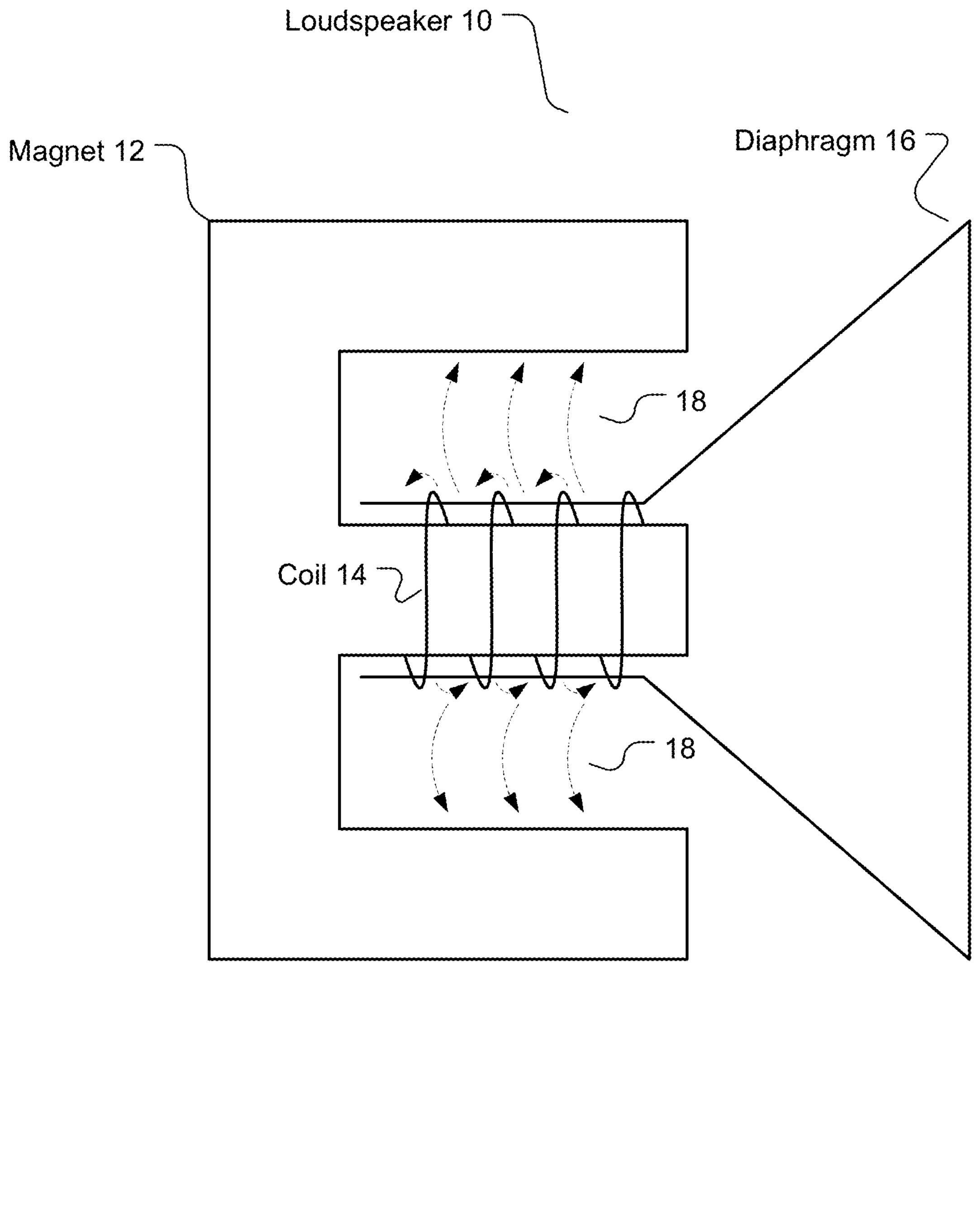
FIG. 1 is a physical diagram of a loudspeaker, according to one embodiment.

FIG. 1 is a physical diagram of a loudspeaker 10, according to one embodiment. Loudspeaker 10 includes a magnet 12, a coil 14, and a diaphragm 16 attached to the coil 14. When an electrical signal is applied to the coil 14, it causes the coil 14 to generate a magnetic field that interacts with the magnetic field of the magnet 12. The coil 14 and the diaphragm 16 move back and forth to produce sound waves. If the coil 14 is closer to the center of the magnet 12, the interaction between the magnetic fields is stronger. If the coil 14 is further from the center of the magnet 12, the interaction is weaker. This changing magnetic field results in a non-constant force that creates acoustical distortion.

The coil 14 also generates an electric field 18 that interacts with the magnet 12. The electric field 18 changes depending on the position of the coil 14 relative to the magnet 12. Similar to the magnetic field, if the coil is in the center of the magnet 12, the electrical field 18 interaction between the coil 14 and the magnet 12 is stronger. If the coil 14 moves away from the magnet 12, the electric field 18 is reduced.

Figure 2:
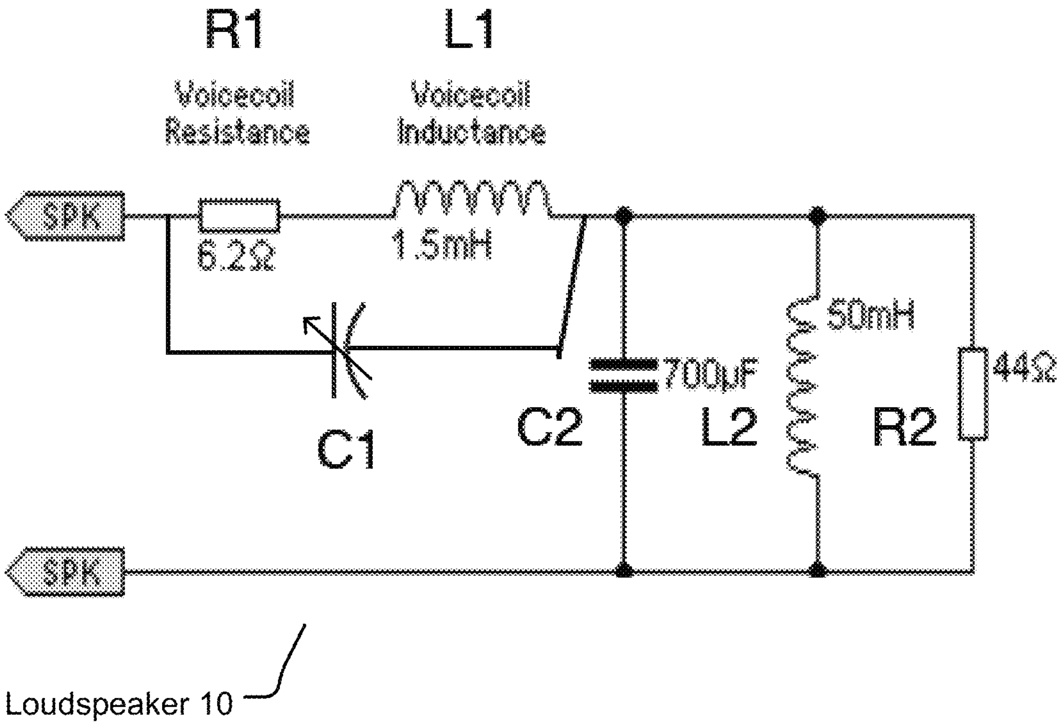
FIG. 2 is an electrical model of a loudspeaker 10 from FIG. 1, according to one embodiment.

FIG. 2 is an electrical model of a loudspeaker 10 from FIG. 1, according to one embodiment. Resistor R1 and inductor L1 model the moving coil 14 inside the loudspeaker 10. Capacitor C2, inductor L2 and resistor R2 model the combined inertia of air, springiness of the diaphragm 16, and induced electromotive force (EMF) caused by the movement of the coil 14. The loudspeaker 10 also includes two speaker terminals through which electrical audio signals can be provided to the speaker.

Capacitor C1 represents a self-capacitance of the loudspeaker 10 caused by the electric field 18 inside the loudspeaker 10. C1 varies with the movement of the coil 14. When a positive voltage is applied to the coil 14, it moves away from the magnet 12, reducing the interaction of the electric field 18 with the magnet 12 and also reducing the capacitance of capacitor C1. When a negative voltage is applied to the coil 14, it moves towards the magnet 12, increasing the interaction of the electric field 18 with the magnet 12 and also increasing the capacitance of capacitor C1. Thus, the value of C1 depends on the position of the coil 14 and diaphragm 16 and is directly linked to the acoustical sound generated by the loudspeaker 10. In some embodiments, C1 varies between 10 pF and 100 pF.

Figure 3:
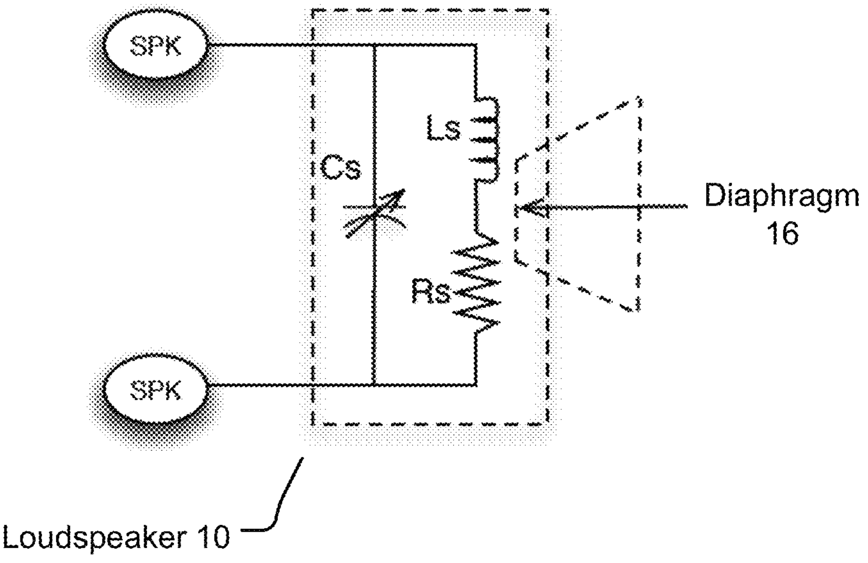
FIG. 3 is a simplified version of the electrical model from FIG. 2 at high frequencies, according to one embodiment

FIG. 3 is a simplified version of the electrical model from FIG. 2 at high frequencies, according to one embodiment. At high frequencies outside of the audio frequency range, such as 10 MHz, C2 is assumed to be a short circuit and so C2, L2, and R2 can all be removed from the circuit model. Resistor Rs represents the high frequency resistance of the loudspeaker 10 and corresponds to resistor R1 from FIG. 2. Inductor Ls represents the high frequency inductance of the loudspeaker 10 and corresponds to inductor L1 from FIG. 2. Capacitor Cs represents the self-capacitance of the loudspeaker 10 and corresponds to capacitor C1 from FIG. 2.

Embodiments of the present disclosure use the capacitance Cs of the coil 14 as a proxy for the displacement of the diaphragm 16. The capacitance Cs can be measured and used as feedback to adjust the level of the electrical signal provided to the loudspeaker 10, thereby compensating for deviations between the electrical signal and the displacement of the coil 14 and diaphragm 16. As a result, the loudspeaker 10 has reduced distortion and better frequency response.

Figure 4:
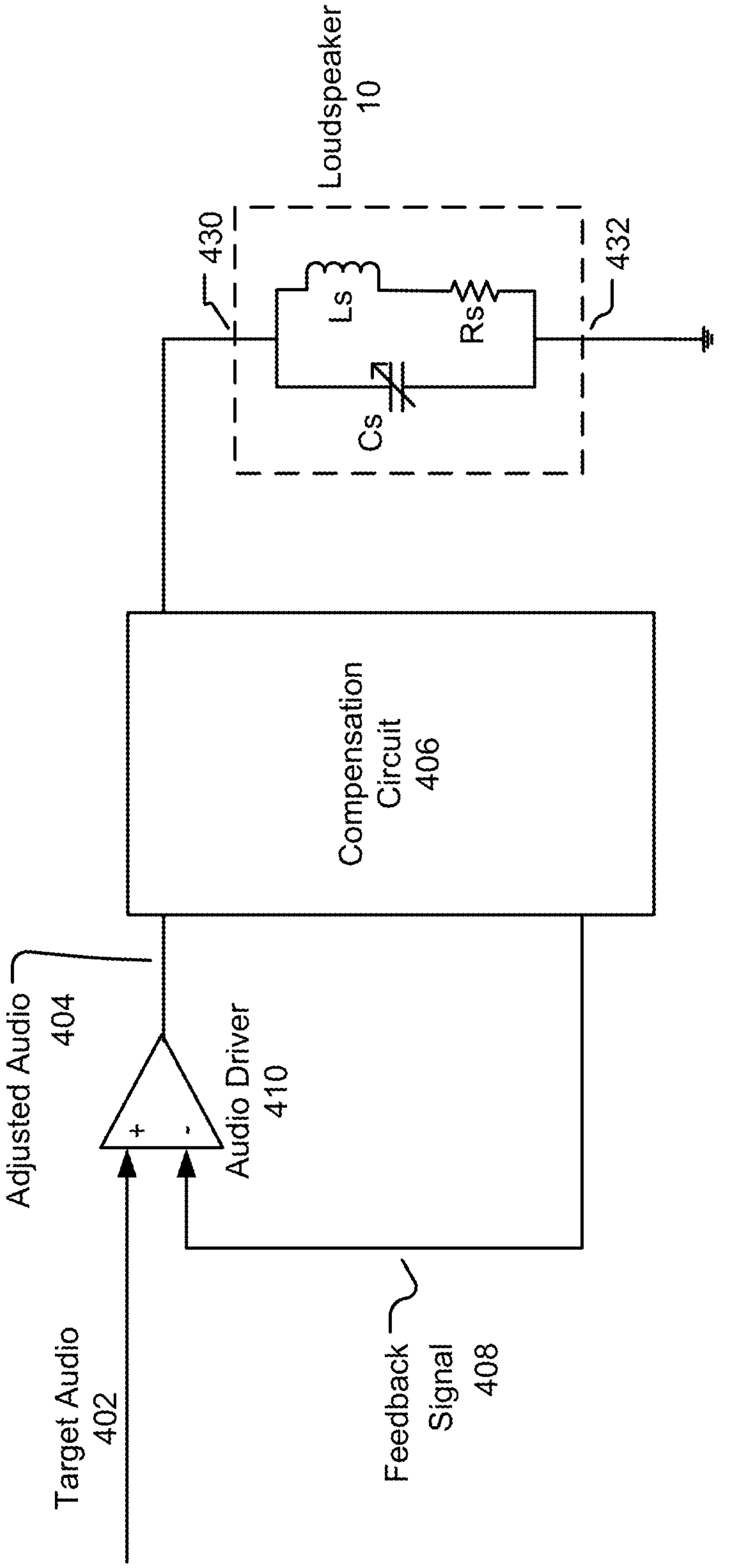
FIG. 4 is a block diagram of an audio system with reduced audio distortion, according to one embodiment.

FIG. 4 is a block diagram of an audio system with reduced audio distortion, according to one embodiment. The audio system includes an audio driver 410 that receives a target audio signal 402 at its positive input and a feedback signal 408 at its negative input. In one embodiment, the target audio signal 402 is in an audible frequency range between 20 to 20,000 Hz and represents sound that is to be produced by the loudspeaker 10. The audio driver compares the target audio signal 402 with the feedback signal 408 to generate an adjusted audio signal 404. In one embodiment, the audio driver 410 may be an audio amplifier or include an amplification stage.

The compensation circuit 406 is coupled to an output of the audio driver 410 and a terminal 430 of the loudspeaker 10. The compensation circuit 406 passes the adjusted audio signal 404 onto the loudspeaker 10, which converts the adjusted audio signal 404 into acoustical sound. The capacitance of the capacitor Cs varies as the adjusted audio signal 404 is converted to acoustical sound by the loudspeaker 10. The compensation circuit 406 also includes a test signal generator (not shown) that injects a high frequency test current into the capacitor Cs. A current level of the high frequency test current is measured and used as an indication of the instantaneous value of capacitor Cs. The measured current is converted to a voltage proportionate to the displacement of the diaphragm 16, which is sent as the feedback signal 408 to the audio driver 410. The loop gain of the audio driver 410 causes the target audio 402 and feedback signal 408 to eventually converge on one another. Since the feedback signal 408 can be an accurate representation of the actual acoustical sound produced by the loudspeaker 10, this ensures that the generated acoustical sound is similar to the target audio signal 402, thereby increasing the fidelity of sound produced by the loudspeaker 10.

The bottom terminal 432 of the loudspeaker 432 is coupled to ground to provide a discharge path for signals input to the loudspeaker via the top terminal 430. In other embodiments, the compensation circuit 406 can also be coupled to the bottom terminal 432 of the loudspeaker 12 or a power supply input of the audio driver 410, as will be explained herein. In other embodiments, the audio driver 410 can be a differential driver instead of a single ended driver.

Figure 5:
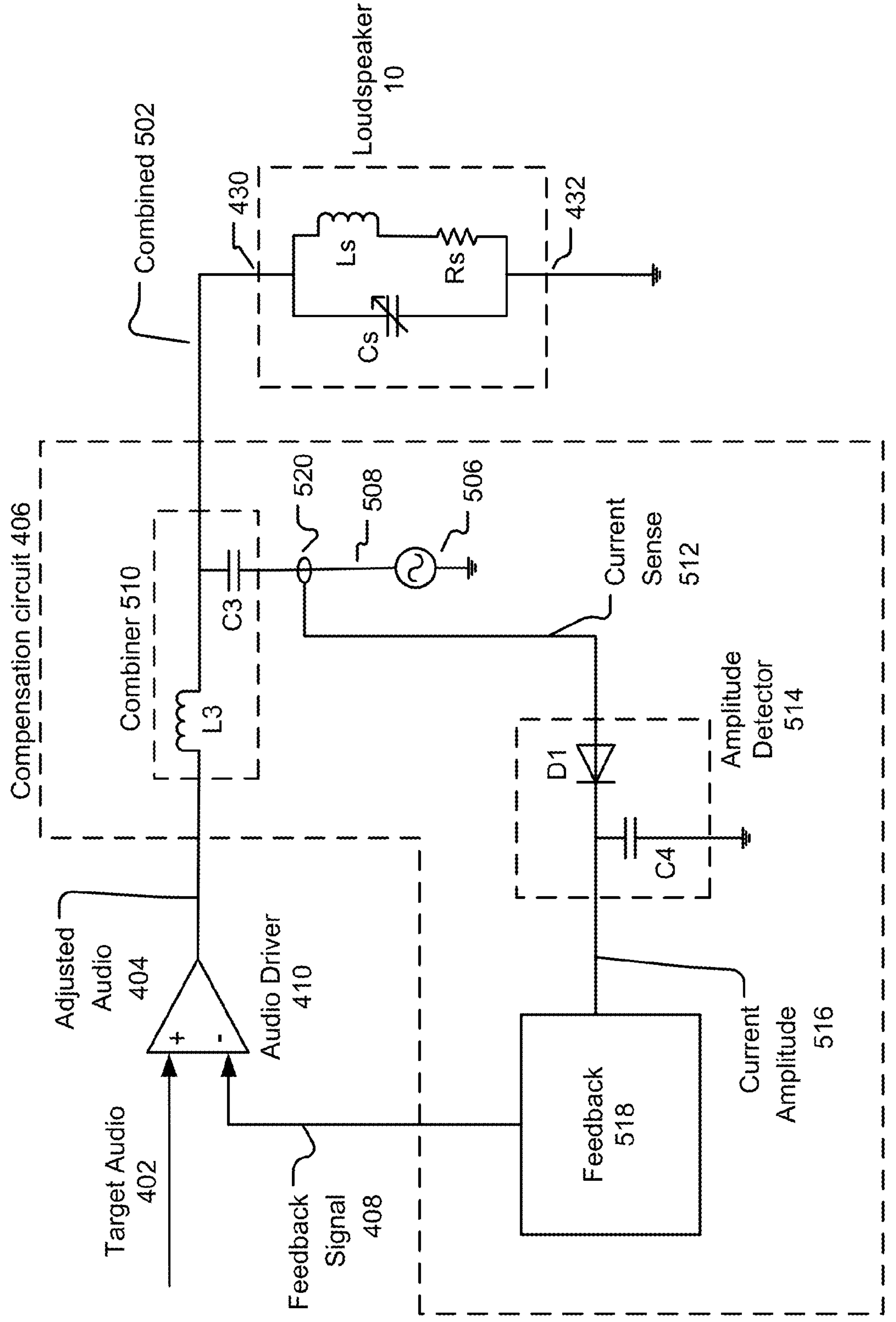
FIG. 5 is a circuit diagram of an audio system with reduced audio distortion, according to one embodiment.

FIG. 5 is a circuit diagram of an audio system with reduced audio distortion, according to one embodiment. The compensation circuit 406 includes a test signal generator 506 that generates an alternating current (AC) test signal 508. The test signal 508 oscillates at a higher frequency than the audio frequency range of the target audio signal 402. For example, the test signal 508 can have a frequency of 10 MHz, which is well above the 20 hz-20 khz range of the target audio signal 402. In one embodiment, the test signal 508 can have a substantially fixed voltage amplitude and a substantially fixed frequency. However, the current of the test signal 508 may vary as the loudspeaker 10 produces acoustical sound.

A combiner circuit 510 is coupled to the output of the audio driver 410 and a terminal 430 of the loudspeaker 10. The combiner circuit 510 combines the test signal 508 with the adjusted audio signal 404 to generate a combined signal 502 that is provided to the loudspeaker 10. Combiner circuit 510 may include an inductor L3 and a capacitor C3. Inductor L3 is selected to pass audio frequencies but to block the frequency of the test signal 508. L3 prevents the current of the test signal 508 from flowing through output of the audio driver 410. Capacitor C3 is selected to block audio frequencies but to pass the frequency of the test signal 508. Capacitor C3 prevents the adjusted audio signal 404 from affecting current measurement of the test signal 508.

The combined signal 502, which includes both an adjusted audio signal portion and a test signal portion, is provided to the top terminal 430 of the loudspeaker 10. The adjusted audio signal portion causes the coil 14 of the loudspeaker 10 to move back and forth, thereby producing acoustical sound that is audible to a listener. The test signal portion of the combined signal 502 generates a test current through the capacitance Cs but does not cause the loudspeaker to produce acoustical sound. Substantially all of the test current for the test signal portion flows through the capacitor Cs and not inductor Ls. This is because the test signal portion operates at a high frequency, and inductor Ls is an open circuit at high frequencies.

The capacitance Cs changes over time as the coil 14 moves back and forth to produce acoustical sound. Because Cs changes and the test current of test signal 508 flows through Cs, the current level of the test signal 508 is dependent on Cs and changes as the value of Cs changes. Thus, when the coil 14 moves further from the magnet, the capacitance Cs decreases and so does the current level of the test signal 508. As the coil 14 moves towards the magnet, the capacitance Cs increases and so does the current level of the test signal 508.

Current measuring circuit 520 is coupled between the test signal generator 506 and the signal combiner 510. Current measuring circuit 520 measures the current level of the test signal 508 (which can have a fixed voltage amplitude and varying current) and generates a current sense signal 512 indicating the measured current level of the test signal 508. The current measuring circuit 520 may include, for example, a series resistor that is coupled between the test voltage generator 506 and the signal combiner 510, as well as a differential amplifier to amplify a voltage difference across the resistor.

Amplitude detector 514 receives the current sense signal 512 and detects the amplitude of the current sense signal 512. The amplitude detector 514 then generates a current amplitude signal 516 that represents the time varying amplitude of the current sense signal 512. As the current level of the test signal 508 is tied to the capacitance Cs of the loudspeaker 10, the instantaneous level of the current amplitude signal 516 also represents the instantaneous capacitance Cs of the loudspeaker 10. In one embodiment, the amplitude detector 514 includes a diode D1 and a capacitor C4 coupled to the output of the diode D1. Diode D1 acts as a half-wave rectifier and capacitor C4 smoothes the half-wave rectified signal to generate the current amplitude signal 516.

The feedback circuit 518 is coupled to the output of the amplitude detector 514 and receives the current amplitude signal 516. The feedback circuit 518 converts the current amplitude signal 516 into a feedback signal 408 that represents the extent of displacement of the diaphragm 16. In one embodiment, the feedback circuit 518 includes a look up table that maps values for the current amplitude signal 516 to displacement values representing the extent of displacement of the diaphragm 16. The displacement values are then converted into voltages that are output as the feedback signal 408. In one embodiment, the mapping between the current amplitude signal 516 and the diaphragm 16 displacement may be determined in advance through actual measurements of the diaphragm 16 displacement and current amplitude signal 516, which are then stored into the look up table.

In other embodiments, the feedback circuit 518 can be a non-linear circuit that converts the current amplitude signal 516 into a feedback signal 408 that represents an approximate extent of the diaphragm 16 displacement.

The audio driver 410 receives the feedback signal 408 and compares the feedback signal 408 to the target audio signal 402 to adjust a level of the adjusted audio signal 404. The loop gain of the audio driver 410 causes the target audio signal 402 and feedback signal 408 to eventually converge onto one another, thereby ensuring that the acoustical output of the loudspeaker 10 matches that of the target audio signal 402.

Figure 6:
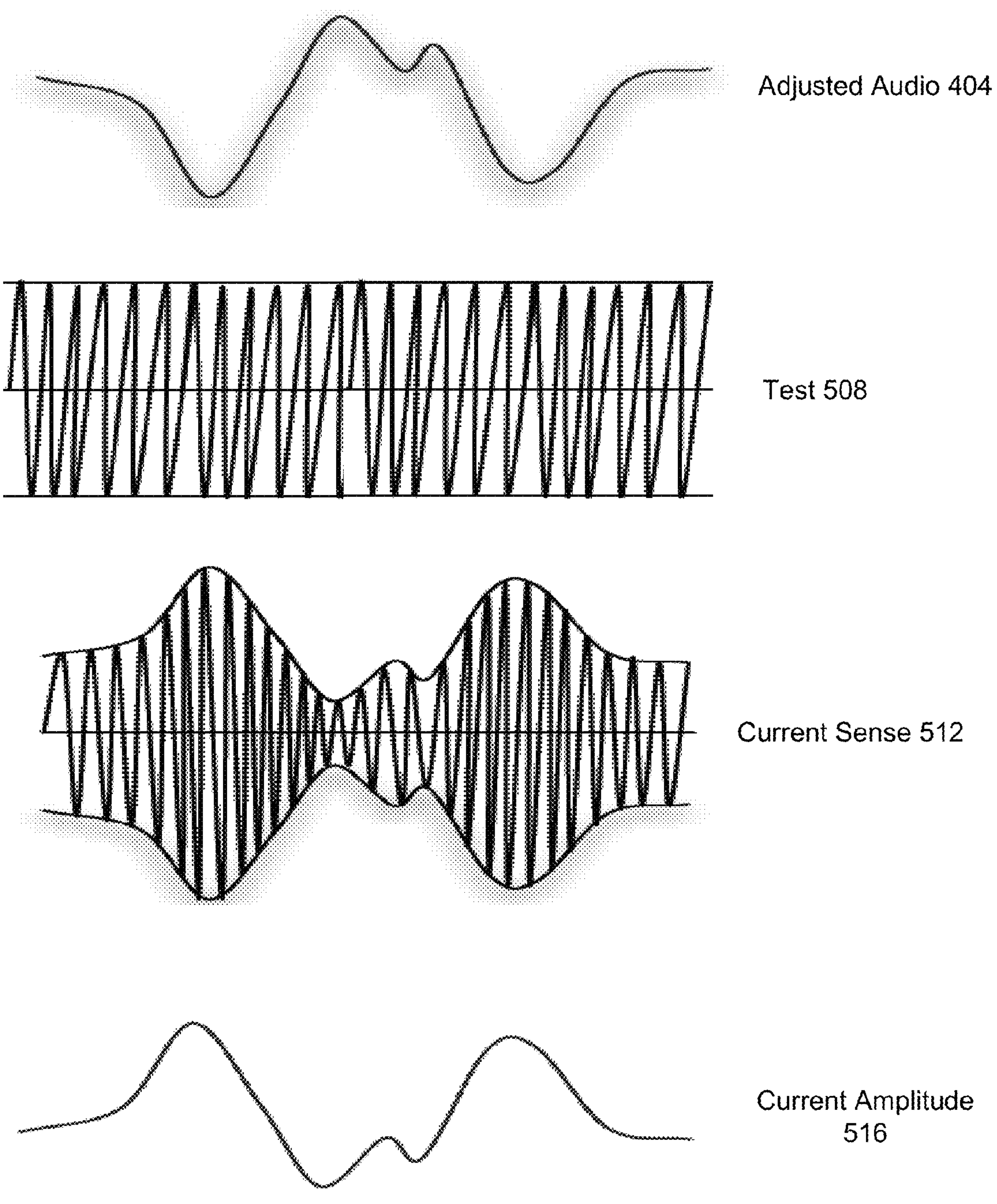
FIG. 6 illustrates signal waveforms of the audio system, according to one embodiment.

FIG. 6 illustrates signal waveforms of the audio system from FIG. 5, according to one embodiment. Signal waveforms are shown for the adjusted audio signal 404, the test signal 508, the current sense signal 512, and the current amplitude signal 516. The adjusted audio signal 404 is a time-varying voltage signal that causes the voice coil 14 to move back and forth to produce acoustical sound. The movement of the coil 14 creates variations in the capacitance Cs of the loudspeaker 10. The test signal 508 has a substantially constant frequency and voltage amplitude. However, the current level of the test signal 508, represented by the current sense signal 512, changes as the capacitance Cs changes. The changing current of the test signal 508 is captured in the voltage level of the current sense signal 512. Finally, the current amplitude signal 516 is the time varying amplitude of the current sense signal 512 and is indicative of the changing current amplitude of the test signal 508 and tracks the changing capacitance Cs of the loudspeaker 10.

Figure 7:
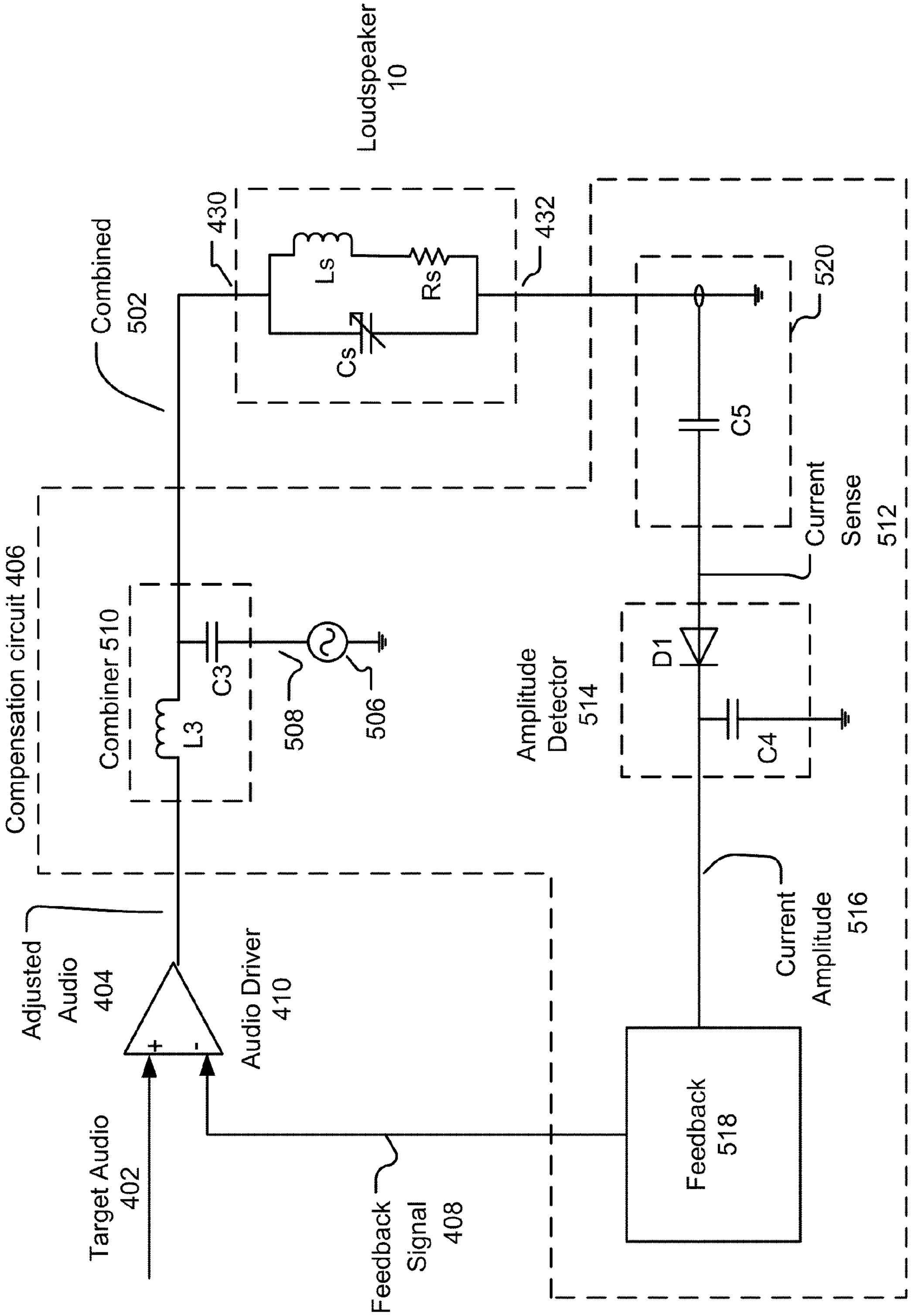
FIG. 7 is a circuit diagram of an audio system with reduced audio distortion, according to another embodiment.

FIG. 7 is a circuit diagram of an audio system with reduced audio distortion, according to another embodiment. The audio system of FIG. 7 is similar to the audio system of FIG. 6, except that the current detector circuit 520 is now coupled to the other terminal 432 of the loudspeaker 10. Current detector circuit 520 still detects a level of a test current flowing through the capacitor Cs but performs the measurement in a slightly different manner.

Specifically, current detector circuit 520 detects a current of the combined signal 502. The current of the combined signal 502 includes both audio frequency components of the adjusted audio signal 404, as well a high frequency component of the test signal 508. To separate the audio frequency components from the high frequency component of the test signal 508, current detector circuit 520 includes a series capacitor C5. Capacitor C5 acts as a high pass filter that filters out the audio frequency components of the detected current but passes the frequency components of the test signal 506. As a result, current sense signal 512 indicates a current level of the test signal 508 but not the adjusted audio signal 404. In other embodiments, capacitor C5 may be placed between the current detector circuit 520 and the loudspeaker 10 to filter out the audio frequency components before detecting the current level of the test signal 508.

Figure 8:
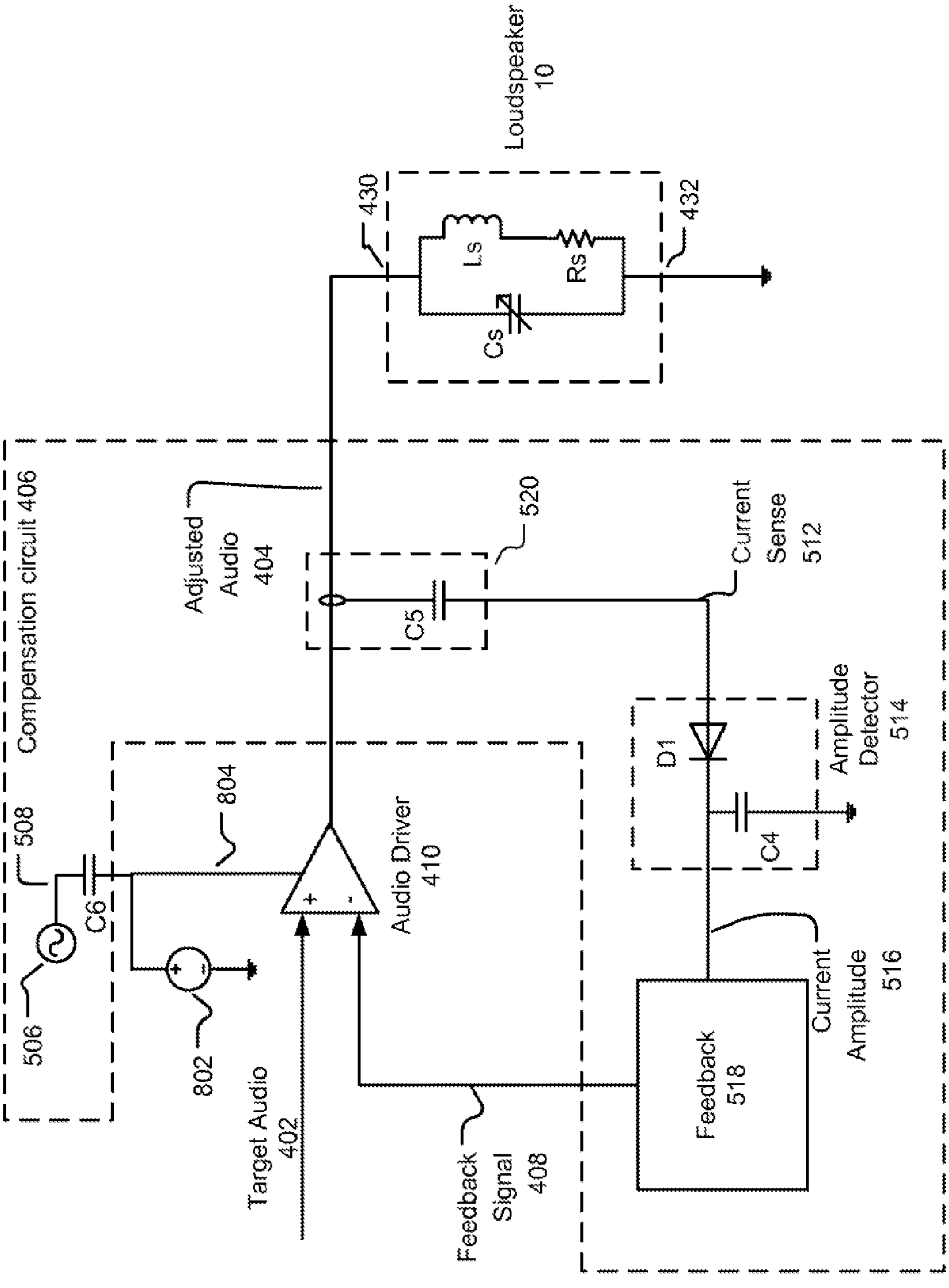
FIG. 8 is a circuit diagram of an audio system with reduced audio distortion, according to yet another embodiment.

FIG. 8 is a circuit diagram of an audio system with reduced audio distortion, according to yet another embodiment. The audio system of FIG. 8 is similar to the audio system of FIG. 7, except that test signal generator 506 is now coupled to a power supply input of the audio driver 410 and indirectly causes a high frequency test current to flow through the speaker 10 by varying the power supply input to the audio driver 410.

As shown, the audio driver 410 is powered by a DC supply 802, such as a battery or other power source. The test signal generator 506 generates a test signal 508 which is combined with the DC supply 802 via capacitor C6 to generate an adjusted power supply voltage 804. The adjusted power supply voltage 804 has both a DC component from the DC supply voltage 802 and an AC component from the test signal generator 506. The AC component of the power supply signal 804 varies the output of the audio driver 410 and causes the adjusted audio signal 404 to have a high frequency AC component that matches the frequency of the test signal 508.

The high frequency AC component of the adjusted audio signal 404 causes a high frequency test current to flow through capacitor Cs of the loudspeaker 10. The current detection circuit 520 measures a current level of the test current. The level of this test current is reflected in the current sense signal 512, amplitude detected by the amplitude detector circuit 514 to generate a current amplitude signal 516, and then used by the feedback circuit 518 to generate the feedback signal 408. The embodiment of FIG. 8 may be simpler to implement than the previous embodiments of FIG. 5 and FIG. 7 due to the lack of a combiner circuit 510 and its associated discrete components.

Figure 9:
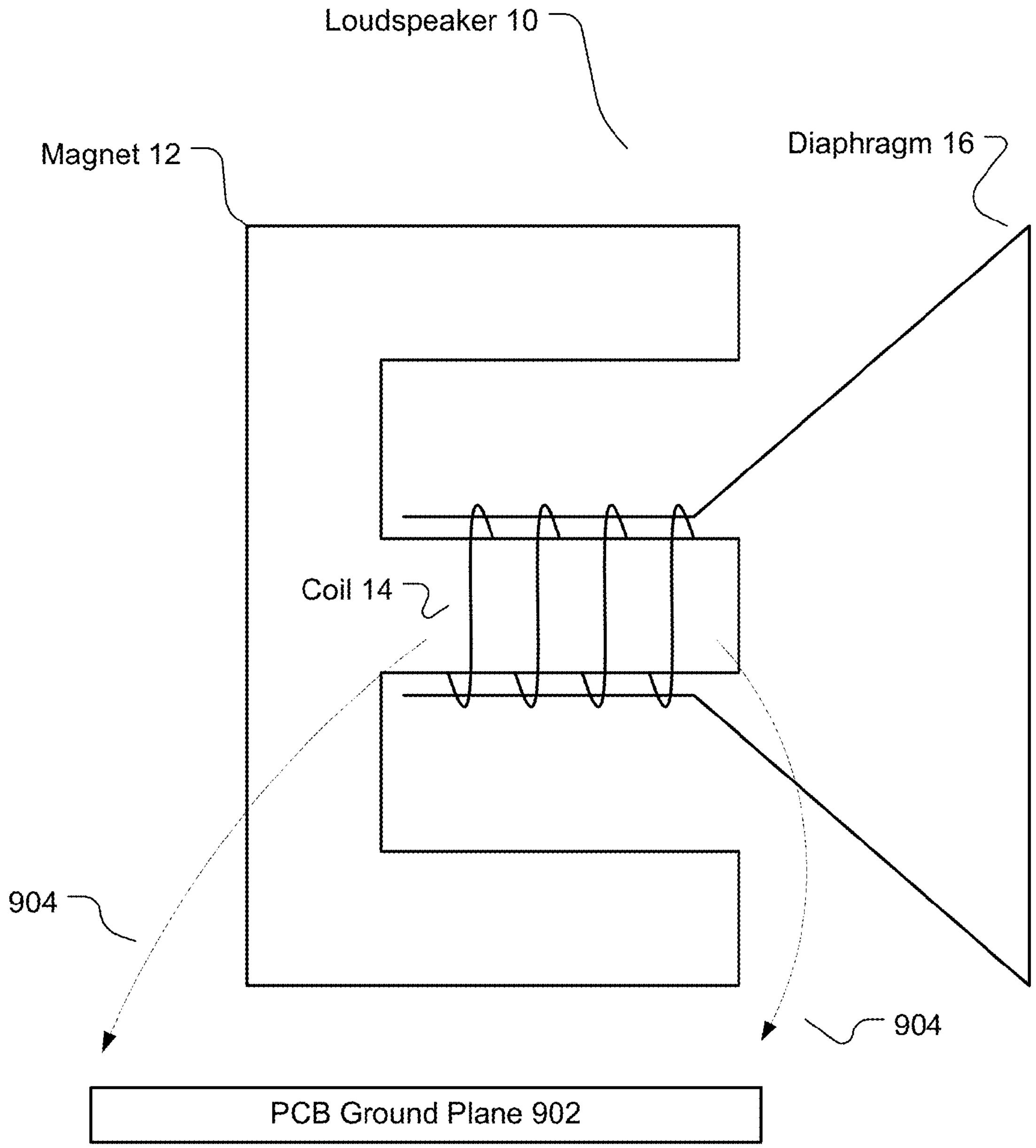
FIG. 9 is a physical diagram of a loudspeaker, according to another embodiment.

FIG. 9 is a physical diagram of a loudspeaker 10, according to another embodiment. The physical diagram of FIG. 9 is similar to that of FIG. 1, but now includes a printed circuit board (PCB) ground plane 902. The PCB ground plane 902 may be, for example, for a PCB that the loudspeaker 10 is mounted to. In other embodiments, the PCB ground plane 902 may be replaced with another grounded object that is adjacent to the loudspeaker 10. The coil 14 also has an electric field 904 that interacts with the ground plane 902 of the PCB. The strength of the electric field 904 changes as the coil 14 and diaphragm 16 move back and forth to produce acoustical sound.

Figure 10:
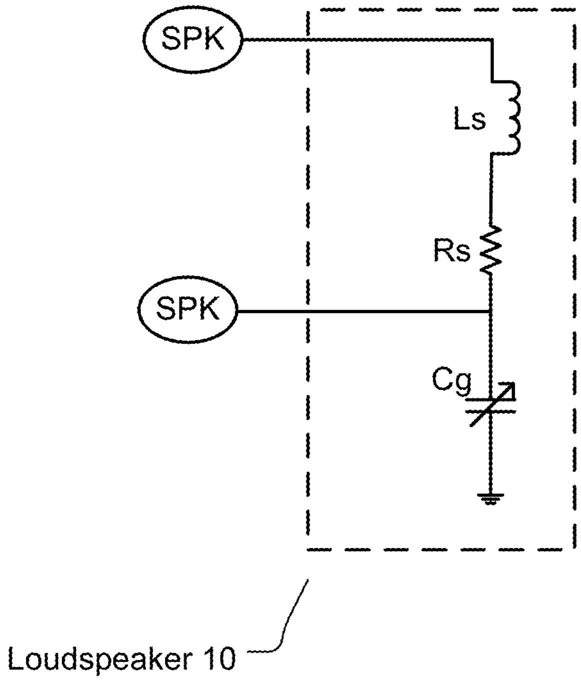
FIG. 10 is simplified electrical model of the loudspeaker from FIG. 9 at high frequencies, according to another embodiment.

FIG. 10 is simplified electrical model of the loudspeaker 10 from FIG. 9 at high frequencies, according to one embodiment. The loudspeaker model from FIG. 10 is similar to the loudspeaker model from FIG. 3, but now the model includes a capacitor Cg in place of capacitor Cs. Capacitor Cg is connected to ground and represents the electric field 904 between the coil 14 and the PCB ground plane 902. The capacitance of capacitor Cg also changes as the coil 14 and diaphragm 16 move back and forth to produce acoustical sound.

Figure 11:
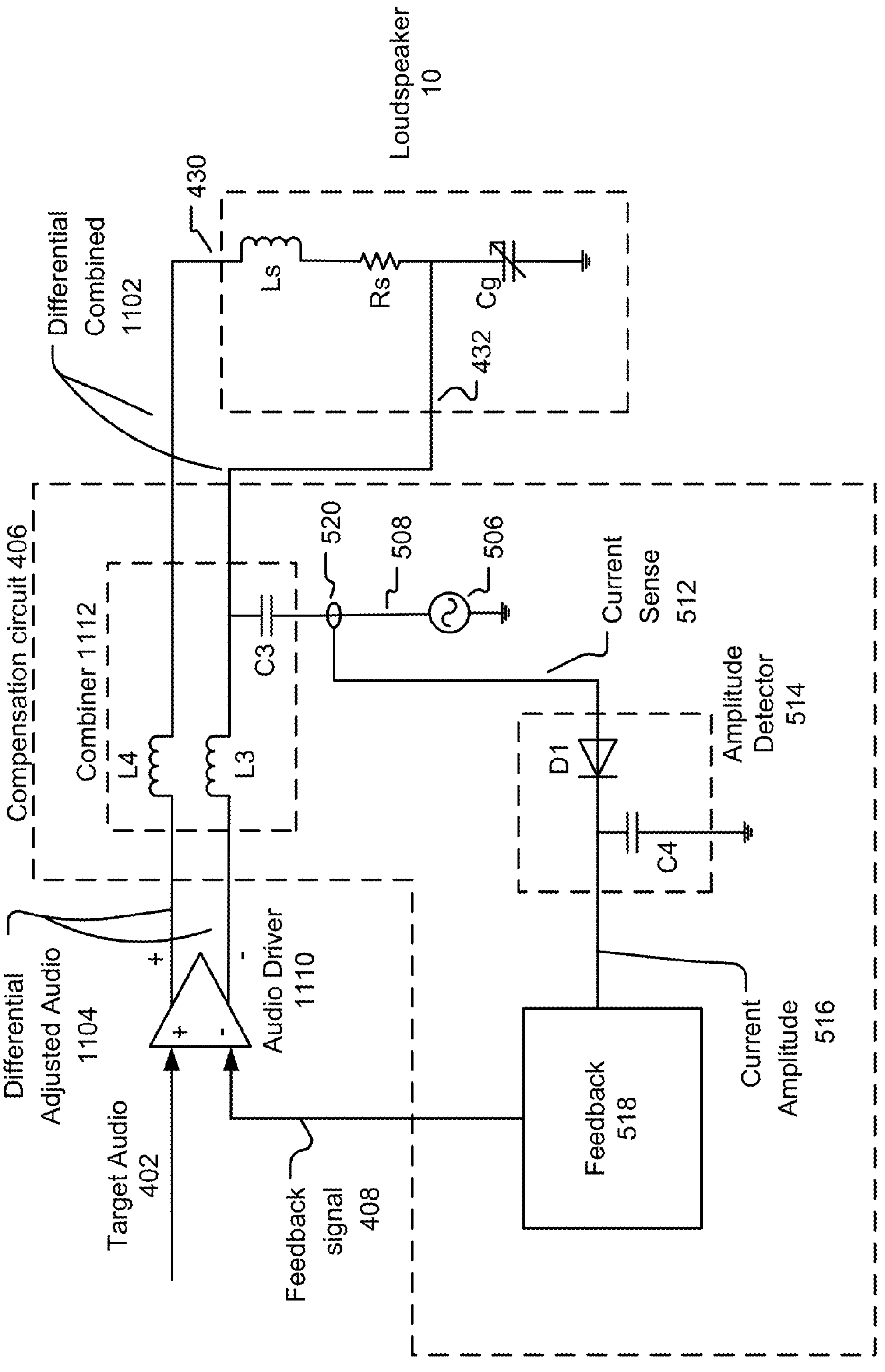
FIG. 11 is a circuit diagram of an audio system with reduced audio distortion, according to a further embodiment.

FIG. 11 is a circuit diagram of an audio system with reduced audio distortion, according to a further embodiment. At a functional level, the audio system of FIG. 11 uses capacitance Cg as a proxy for the displacement of the diaphragm 16. The audio system measures a current through the capacitance Cg and uses the current to generate feedback signal 408 for adjusting the level of the adjusted audio signal 404, thereby compensating for deviations between the target audio signal 402 and the actual displacement of the diaphragm 16.

At a circuit level, the audio system of FIG. 11 is similar to the audio system of the FIG. 5 but now includes a differential audio driver 1110 that outputs a differential adjusted audio signal 1104. Signal combiner 1112 is also different and now includes two inductors L3 and L4 coupled between the outputs of the audio driver 1110 and the loudspeaker 10. Inductors L3 and L4 are chokes that block the test signal 506 from flowing back through the outputs of the audio driver 1110.

Signal combiner 510 combines test signal 508 with the differential adjusted audio signal 1104 to generate a differential combined signal 1102. The adjusted audio signal portion of the combined signal 1102 is converted to acoustical sound by the loudspeaker 10. Capacitor Cg changes as the loudspeaker 10 produces acoustical sound. The test signal 506 is blocked by inductor L4 and L3, and so the only discharge path available to the test signal 506 is through capacitor Cg. The current sensing circuit 520 measures the current level of the test signal 506, which represents the amount of test current flowing through capacitor Cg. Current sensing circuit 520 then generates current sensing signal 512 to indicate a current level of the test signal 506.

Amplitude detector 514 detects an amplitude of the current sense signal 512 and generates a current amplitude signal 516. Feedback circuit 518 receives the current amplitude signal 516 and uses the current amplitude signal 516 to generate a feedback signal 408. In one embodiment, feedback circuit 518 uses a look up table that maps levels of the current amplitude signal 516 to displacement values that are used to generate the feedback signal 408. The look up table for the feedback circuit 518 in FIG. 11 may have different values than the look up table for the feedback circuit 518 in FIG. 5.

Audio driver 1110 receives the target audio signal 402 and the feedback signal 408 and generates the differential adjusted audio signal 1104 by comparing its two input signals. The resulting adjusted audio signal 1104 compensates for deviations between the target audio signal 402 and the actual movement of the loudspeaker diaphragm 16. As a result, the displacement of the speaker diaphragm 16 matches that of the target audio signal 402 to increase the audio fidelity of the audio system.

Upon reading this disclosure, those of skill in the art will appreciate still additional alternative designs for reducing audio distortion in an audio system. Thus, while particular embodiments and applications have been illustrated and described, it is to be understood that the embodiments discussed herein are not limited to the precise construction and components disclosed herein and that various modifications, changes and variations which will be apparent to those skilled in the art may be made in the arrangement, operation and details of the method and apparatus disclosed herein without departing from the spirit and scope of the disclosure.

What is claimed is:

1. An audio system comprising:

an audio driver configured to receive a target audio signal and a feedback signal and to generate an adjusted audio signal responsive to the target audio signal and the feedback signal;

a loudspeaker configured to convert the adjusted audio signal into acoustical sound;

a test signal generator coupled to a power supply input of the audio driver, the test signal generator being configured to generate a test signal having a higher frequency than the target audio signal and adjust a power supply of the audio driver with the test signal to generate an adjusted power supply for the audio driver that introduces variations in the adjusted audio signal causing a test current to flow through the loudspeaker;

a current sensing circuit configured to measure the test current flowing through the loudspeaker and to generate a current sense signal indicative of the test current; and a feedback circuit configured to generate the feedback signal responsive to the current sense signal.

2. The audio system of claim 1 further comprising an amplitude detector coupled to the current sensing circuit and configured to generate a current amplitude signal indicative of an amplitude of the current sense signal, the feedback circuit being configured to generate the feedback signal responsive to the current amplitude signal.

3. The audio system of claim 2 wherein the feedback circuit includes a lookup table that maps values for the current amplitude signal to values for the feedback signal.

4. The audio system of claim 2 wherein the feedback circuit generates the feedback signal to have a non-linear relationship to the current amplitude signal.

5. The audio system of claim 1 wherein the test signal has a substantially constant peak-to-peak voltage amplitude and the test current changes over time as a diaphragm of the loudspeaker is displaced to convert the adjusted audio signal into acoustical sound.

6. The audio system of claim 1 further comprising a signal combiner circuit configured to generate a combined signal by combining the adjusted audio signal and the test signal, the loudspeaker converting a portion of the combined signal corresponding to the adjusted audio signal to acoustical sound, a portion of the combined signal corresponding to the test signal causing the test current to flow through the loudspeaker.

7. The audio system of claim 1 wherein the audio driver compares the target audio signal to the feedback signal to generate the adjusted audio signal.

8. The audio system of claim 1 wherein the audio driver is a single ended driver.

9. The audio system of claim 1 wherein the audio driver is a differential driver.

10. The audio system of claim 1 wherein the current sensing circuit includes a capacitor configured to block audio frequencies and to pass a frequency of the test signal.

11. A method of operation in an audio system including a loudspeaker comprising:

generating an adjusted audio signal by an audio driver responsive to a target audio signal and a feedback signal representative of an approximate displacement of a diaphragm of the loudspeaker;

converting the adjusted audio signal into acoustical sound with the loudspeaker;

generating a test signal having a higher frequency than the target audio signal;

adjusting a power supply of the audio driver with the test signal to generate an adjusted power supply that introduces variations in the adjusted audio signal causing a test current to flow through the loudspeaker;

measuring the test current flowing through the loudspeaker;

generating a current sense signal indicative of the test current; and generating the feedback signal responsive to the current sense signal.

12. The method of claim 11 further comprising generating a current amplitude signal indicative of an amplitude of the current sense signal and generating the feedback signal responsive to the current amplitude signal.

13. The method of claim 12 wherein generating the feedback signal includes mapping values for the current amplitude signal to values for the feedback signal with a lookup table.

14. The method of claim 12 wherein the feedback signal is generated to have a non-linear relationship to the current amplitude signal.

15. The method of claim 11 wherein the test signal has a substantially constant peak-to-peak voltage amplitude and the test current changes over time as the diaphragm is displaced to convert the adjusted audio signal into acoustical sound.

16. The method of claim 11 further comprising generating a combined signal by combining the adjusted audio signal and the test signal and converting a portion of the combined signal corresponding to the adjusted audio signal to acoustical sound, a portion of the combined signal corresponding to the test signal causing the test current to flow through the loudspeaker.

17. The method of claim 11 wherein the adjusted audio signal is generated by comparing the target audio signal to the feedback signal to generate the adjusted audio signal.

18. The method of claim 11 wherein the adjusted audio signal is generated with a single ended audio driver.

19. The method of claim 11 wherein the adjusted audio signal is generated with a differential audio driver.

* * * * *